(12) United States Patent
Basaran et al.

(10) Patent No.: US 8,610,495 B2
(45) Date of Patent: Dec. 17, 2013

(54) ADAPTIVE FILTERING OF BLOCKER SIGNALS IN DEMODULATORS

(75) Inventors: Umut Basaran, Unterhaching (DE); Ashkan Naeini, Munich (DE)

(73) Assignee: Intel Mobile Communications GmbH, Neubiberg (DE)

( * ) Notice: Subject to any disclaimer, the term of this patent is extended or adjusted under 35 U.S.C. 154(b) by 17 days.

(21) Appl. No.: 13/328,388

(22) Filed: Dec. 16, 2011

(65) Prior Publication Data

US 2013/0154728 A1 Jun. 20, 2013

(51) Int. Cl.
*H03D 1/06* (2006.01)
*H04B 1/10* (2006.01)

(52) U.S. Cl.
USPC ............ 329/349; 330/98; 330/100; 455/296; 455/311

(58) Field of Classification Search
USPC ......... 329/315, 318, 319, 320, 347, 349, 351, 329/353; 455/295, 296, 303, 304, 305, 306, 455/307, 310, 311, 312; 330/291, 293, 302, 330/303, 98–100, 310, 294, 75
See application file for complete search history.

(56) References Cited

U.S. PATENT DOCUMENTS 6,552,605 B1 * 4/2003 Yoon .................................. 330/9
7,173,486 B1 * 2/2007 Sutardja ........................ 330/107
7,948,309 B2 * 5/2011 Mak et al. ....................... 330/98

OTHER PUBLICATIONS

Giannini, Vito, et al. "A 2mm^2 0.1-to-5GHz SDR receiver in 45nm digital CMOS." Solid-State Circuits Conference-Digest of Technical Papers, 2009. ISSCC 2009. IEEE International. IEEE, 2009.*
Alfredo Perez-Carrillo, et al., "A Large-Signal Blocker Robust Transimpedance Amplifier for Coexisting Radio Receivers in 45nm CMOS", IEEE, 2011, p. 1-4, Jun. 5-7, 2011.
Jonathan Borremans, et al., "A 40nm CMOS 0.4-6GHz Receiver Resilient to Out-of-Band Blockers", IEEE Journal of Solid-State Circuits, vol. 46, No. 7, Jul. 2011, p. 1659-1671.
Fikret Duelger, "RF IC Design for Cellular Transceiver Front-Ends on Silicon", May 19, 2009. p. 1-60.

* cited by examiner

*Primary Examiner* — Ryan Johnson
(74) *Attorney, Agent, or Firm* — Eschweiler & Associates, LLC

(57) ABSTRACT

Some embodiments of the invention relate a transimpedance amplifier circuit having a negative feedback network that provides additional filtering of an out-of-band transmitted signal is provided herein. In one embodiment, the transimpedance amplifier circuit has a first pole, transimpedance amplifier having a multi-stage operational amplifier with an input terminal and an output terminal. An RC feedback network extends from the output terminal to the input terminal. A negative feedback network, extending from an internal node of the multi-stage operational amplifier to an input terminal of the single pole, transimpedance amplifier provides a negative feedback signal with an amplitude having an opposite polarity as the out-of-band transmitted signal. The negative feedback signal suppresses the out-of-band-transmitted signals within the demodulator circuit, thereby improving linearity of the transimpedance amplifier circuit.

19 Claims, 6 Drawing Sheets

ADAPTIVE FILTERING OF BLOCKER SIGNALS IN DEMODULATORS

BACKGROUND

Transceivers are configured to transmit and receive radio frequency (RF) signals. Transceivers operate to transmit data by modulating the data onto a high frequency carrier signal that is transmitted wirelessly. Transceivers operate to receive data by receiving a modulated high frequency wireless signal and by providing the received signal to a demodulator. The demodulator is configured to downconvert the received high frequency signal to an intermediate frequency, from which the data that was transmitted is recovered.

DRAWINGS

DETAILED DESCRIPTION

Figure 1:
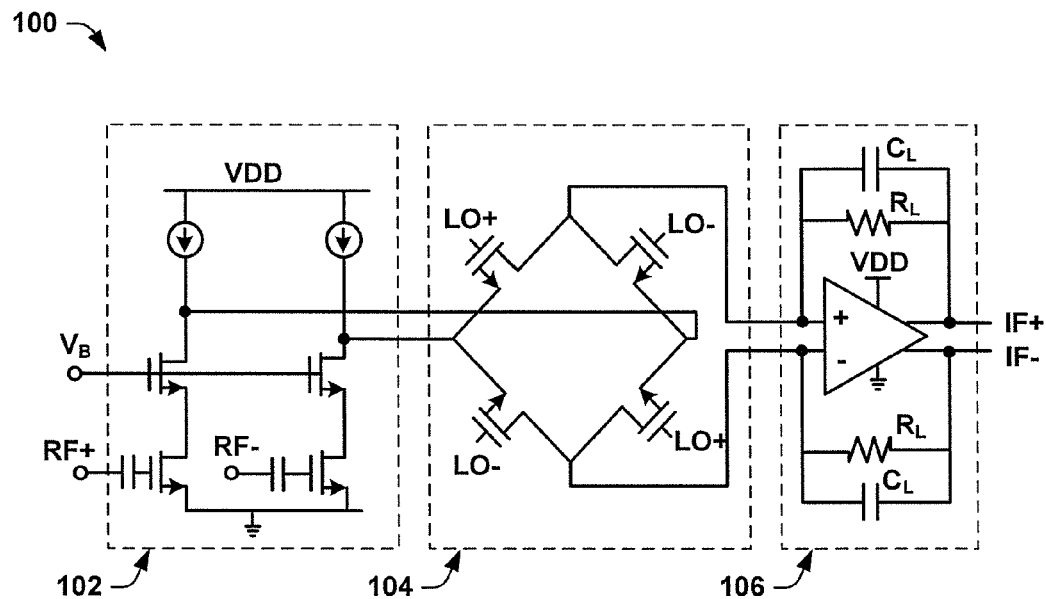
FIG. 1 illustrates a schematic diagram of an exemplary demodulator comprising a transimpedance amplifier.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details.

FIG. 1 illustrates a demodulator 100 configured to demodulate a received differential RF signal. The demodulator 100 comprises an input/pre-amplifier stage 102, a mixer 104, and a transimpedance amplifier 106. The input/pre-amplifier stage 102 is configured to receive a radio frequency (RF) signal as an input voltage RF+/RF− (e.g., from an antenna not shown in FIG. 1) and to convert the received RF signal to a current signal. The current signal is provided to the mixer 104, where it is multiplied with a local oscillator (LO) signal LO+/LO− to generate an intermediate frequency (IF) current signal. The IF current signal flows from the mixer 104 to a transimpedance amplifier 106 that is configured to convert the IF current signal back to a voltage signal while providing filtering of the IF current signal.

During operation, non-linearities in the demodulator 100 can cause distortion of the received RF signal. For example, in a full duplex mode, wherein a transceiver concurrently transmits and receives RF signals, the high power transmission signal may cause out-of-band interfere with received signals within the demodulator 100. In recent years, this problem has become worse as increasing bandwidths used for high data transfer rates have reduced the frequency difference between the received signal and the transmitted signal.

Accordingly, a transimpedance amplifier circuit having a negative feedback network configured to provide additional filtering of an out-of-band transmitted signal is provided herein. In one embodiment, the transimpedance amplifier circuit comprises a transimpedance amplifier having a multi-stage operational amplifier with an input terminal and an output terminal. An RC feedback network extends from the output terminal to the input terminal. A negative feedback network, extending from an internal node of the multi-stage operational amplifier to an input terminal of the single pole, transimpedance amplifier is configured to provide a negative feedback signal with an amplitude having an opposite polarity as the out-of-band transmitted signal. The negative feedback signal suppresses the out-of-band-transmitted signals within the demodulator circuit, thereby improving linearity of the transimpedance amplifier circuit.

Figure 2:
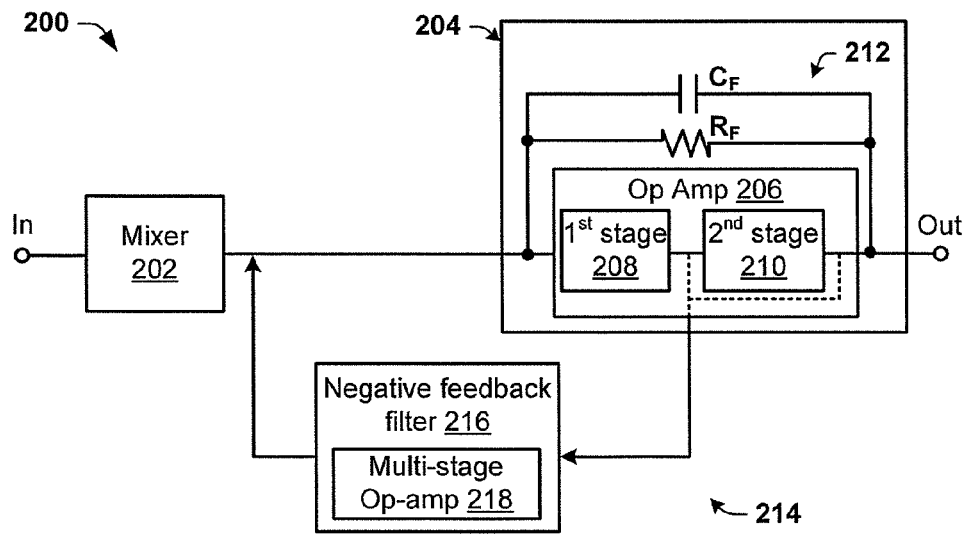
FIG. 2 illustrates a block diagram of some embodiments of a demodulator comprising a transimpedance amplifier having a negative feedback network.

FIG. 2 illustrates a block diagram of some embodiments of a demodulator circuit 200 comprising a transimpedance amplifier 204 having a negative feedback network 214.

As shown in FIG. 2, a mixer 202 is configured to provide an input current signal to a transimpedance amplifier 204 configured to filter the input current. In some embodiments, the transimpedance amplifier 204 comprises a first pole, transimpedance amplifier (TIA) having an operational amplifier 206 and an RC feedback network 212. The operational amplifier 206 often comprises a multi-stage operational amplifier. The multi-stage operational amplifier 206 may comprise a first operational amplifier stage 208 and a second operational amplifier stage 210, located downstream of the first operational amplifier stage 208. The first and second operational amplifier stages 208, 210 cumulatively perform the functionality of a single operational amplifier. The RC feedback network 212 extends from the output of the last stage of the multi-stage operational amplifier 206 to the input of the first stage of the multi-stage operational amplifier 206.

A negative feedback network 214 is connected from within the transimpedance amplifier 204 to the input of the transimpedance amplifier 204. The negative feedback network 214 is configured to provide a negative feedback signal to the input terminal of the transimpedance amplifier. The negative feedback signal has a frequency that corresponds to the frequency of an out-of-band transmitted signal and an amplitude having an opposite polarity as the out-of-band transmitted signal. In some embodiments, the negative feedback network 214 comprises a negative feedback filtering element 216 configured to filter the frequency range of a feedback signal within the negative feedback network 214 so as to generate a negative feedback signal that attenuates out-of-band transmitted signals without interfering with the receiver signal. In various embodiments, the negative feedback filtering element 216 may comprise one or more of an active filter, a band pass filter, and a high pass filter, for example.

To ensure a good common-mode and differential stability within the demodulator circuit 200 the negative feedback network 214 has a circuit topology that comprises a multi-stage operational amplifier having a specific number of operational amplifier stages. In some embodiments, the multi-stage operational amplifier provides for an odd number of operational amplifier stages between the input terminal of operational amplifier 206 and the input terminal of the transimpedance amplifier 204 (i.e., along the path of the negative feedback network 214). The odd number of operational amplifier stages provides good stability, in contrast to an even number of operational amplifier stages that cause stability issues, especially for common-mode signals.

In some embodiments the negative feedback network 214 is connected to the transimpedance amplifier 204 after an odd number of operational amplifier stages within operational amplifier 206 (e.g., the negative feedback network 214 extends from an internal node of the operational amplifier located between the first and second operational amplifier stages 208, 210 to the input of the transimpedance amplifier 204). In such an embodiment the negative feedback network 214 comprises an even number of operational amplifier stages, resulting in an overall odd number of operational amplifier stages between the input terminal of operational amplifier 206 and the input terminal of the transimpedance amplifier 204. The even number of operational amplifier stages in the negative feedback network provides a positive gain at the transmitter frequency. If an odd number of amplifying stages are not present between the input terminal of operational amplifier 206 and the input terminal of the transimpedance amplifier 204, this positive gain leads to a common-mode instability. However, by using an odd number of amplifying stages, the positive gain can provide a negative feedback signal to be output from the negative feedback filtering element 216.

In other embodiments, the negative feedback network 214 is connected after an even number of operational amplifier stages within operational amplifier 206 (e.g., the negative feedback network 214 extends from the output of a two-stage operational amplifier to the input of the transimpedance amplifier 204). In such embodiments, the negative feedback network 214 comprises an operational amplifier having an odd number of operational amplifier stages, resulting in an overall odd number of operational amplifier stages between the input terminal of operational amplifier 206 and the input terminal of the transimpedance amplifier 204. The odd number of operational amplifiers provides for a negative feedback signal to be output from the negative feedback filtering element 216.

Figure 3:
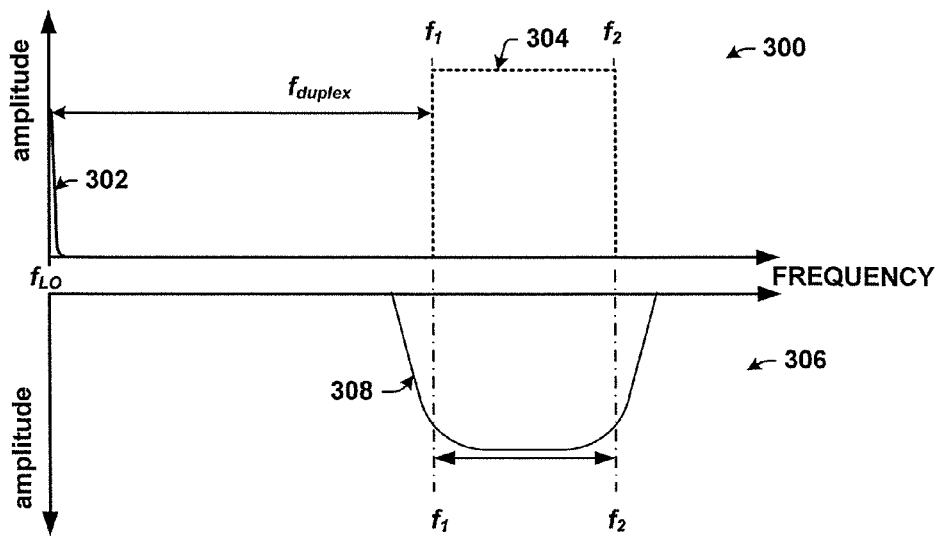
FIG. 3 illustrates exemplary graphs showing the frequency of a received signal, a transmitted signal, and a negative feedback signal, corresponding to a disclosed transimpedance amplifier circuit.

FIG. 3 illustrates graphs 300, 306 showing the frequency and amplitude of signals within a disclosed demodulator circuit having a transimpedance amplifier with a negative feedback network (e.g., corresponding to demodulator circuit 200). The graphs 300, 306 show the frequency (x-axis) of a received signal 302, an out-of-band transmitted signal 304, and a negative feedback signal 308 as a function of amplitude (y-axis).

Graph 300 illustrates a received signal 302 and an out-of-band transmitted signal 304 within a demodulator. As shown in graph 300, the received signal 302 has a local oscillator frequency at 0 Hz. Although a transceiver is designed to transmit signals at a different frequency than it receives signals, transmitted signals (transmitted source signals) may produce an out-of-band transmitted signal 304 in the receiver frequency band (e.g., harmonics of the transmitted source signal). The frequency of the out-of-band transmitted signal 304 and the received signal 302 are separated by a duplex distance $f_{duplex}$ that is equal to the distance between the received signal 302 (i.e., the downlink frequency) and the out-of-band transmitted signal 304 (i.e., the uplink frequency). The relatively small size of frequency $f_{duplex}$ results in the out-of-band transmitted signal 304 causing interference with the received signal 302.

Graph 306 illustrates a negative feedback signal 308 provided by the negative feedback network disclosed herein (e.g., corresponding to negative feedback network 214). In general, the negative feedback signal 308 has a frequency, between corner frequencies $f_1$ and $f_2$, which corresponds to the frequency of the out-of-band transmitted signal 304. The negative feedback signal 308 also comprises an amplitude having an opposite polarity as the out-of-band transmitted signal 304. The negative feedback signal 308 is added to the input of a transimpedance amplifier to reduce the amplitude of the out-of-band transmitted signal 304. Therefore, the negative feedback network is configured to attenuate the out-of-band transmitted signal 304 within a demodulator circuit to reduce interference. By attenuating the transmitted signal with a negative feedback signal, the feedback network provides additional filtering of the out-of-band transmitted signal 304 without distorting the received signal 302.

In some embodiments, wherein the negative feedback network comprises an active filter, the corner frequencies $f_1$ and $f_2$ of the negative feedback signal 308 can be tuned to the frequency of the out-of-band transmitted signal 304. This allows the out-of-band transmitted signal 304 to be selectively filtered by the negative feedback signal 308. This results in a significantly improved linearity and relaxes the headroom requirements in the transimpedance amplifier.

Figure 4:
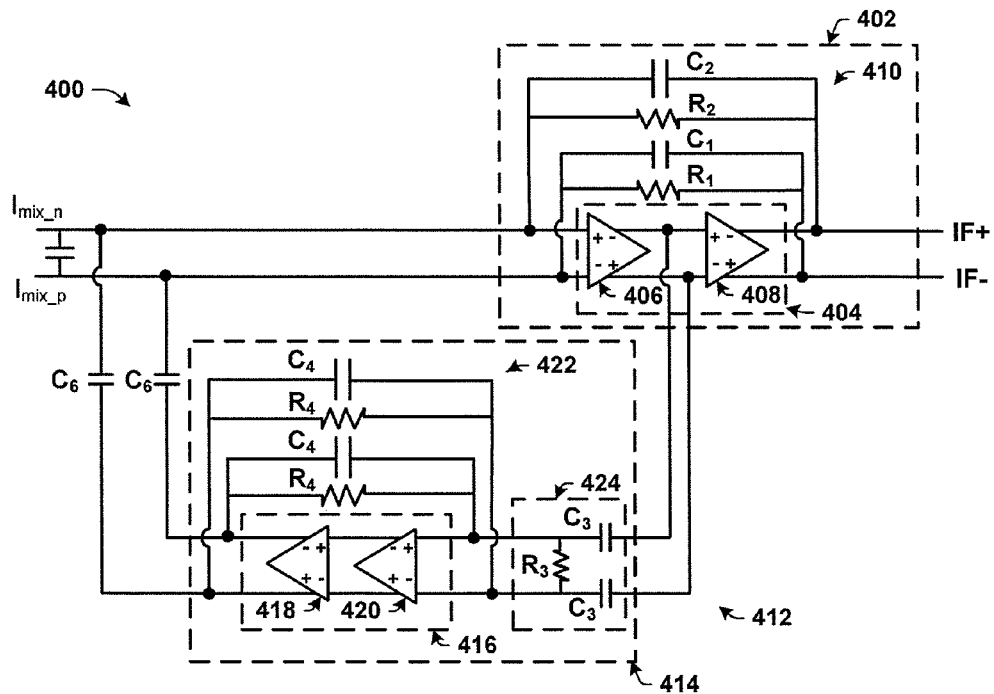
FIG. 4 illustrates a schematic diagram of some embodiments of a transimpedance amplifier circuit having a negative feedback network.

FIG. 4 illustrates a schematic diagram of some embodiments of a differential transimpedance amplifier circuit 400 having a first pole, transimpedance amplifier 402 and a negative feedback network 412. As shown in FIG. 4, the transimpedance amplifier circuit 400 comprises a negative feedback network 412 configured to filter differential N-P complementary input signals $I_{mix\_n}$, $I_{mix\_p}$ of the first pole, transimpedance amplifier 402 to remove out-of-band interference. Although the demodulator circuits shown herein (e.g., in FIGS. 4, 6, 8, etc.) are illustrates as differential circuits, it will be appreciated that the apparatus provided herein is not limited to differential circuits. Instead, the method and apparatus provided herein may also be applied to single ended circuits.

The first pole, transimpedance amplifier 402 comprises a multi-stage operational amplifier 404 and an RC filter 410. The multi-stage operational amplifier 404 has a first operational amplifier stage 406 and a second operational amplifier stage 408. The first operational amplifier stage 406 comprises input terminals of the operational amplifier 404. The second operational amplifier stage 408 comprises output terminals of the operational amplifier 404. The operational amplifier 404 is configured to produce an amplified signal that includes noise gain produced by the operational amplifier 404. The RC filter 410 comprises one or more feedback loops connected between the output terminals and the input terminals of the operational amplifier 404. Respective feedback loops comprise a high-voltage active RC filter having a capacitor $C_1$ or $C_2$ and resistor $R_1$ or $R_2$ configured in parallel. The capacitors $C_1$, $C_2$ and resistors $R_1$, $R_2$ are connected between the input and output terminals of the operational amplifier 404.

The resistors $R_1$, $R_2$ and capacitors $C_1$, $C_2$ behave like an RC filter. For example, at low frequencies the feedback capacitors $C_1$, $C_2$ act like an open circuit blocking feedback signals while the feedback resistors $R_1$, $R_2$ give the circuit the characteristics of an inverting amplifier. At high frequencies the capacitors $C_1$, $C_2$ short out the feedback resistors $R_2$, $R_2$ and act as an integrator.

The negative feedback network 412 is connected between the output of the first operational amplifier stage 406 and the input of the first pole, transimpedance amplifier 402. The negative feedback network 412 comprises a negative feedback filtering element 414 that provides the transimpedance amplifier circuit 400 with an additional filtering element that is configured to provide filtering of the current signal input to first pole, transimpedance amplifier 402 by way of a negative feedback signal having an opposite amplitude of out-of-band interferes.

The negative feedback filtering element 414 comprises an active band pass filter having a multi-stage amplifying element 416 and an RC band pass filter 422. As shown in FIG. 4, the multi-stage amplifying element 416 has a first operational amplifier stage 418 and a second operational amplifier stage 420. The RC band pass filter 422 comprises one or more feedback loops connected between the output and the input of the multi-stage amplifying element 416. Respective feedback loops comprise a high-voltage RC filter having a capacitor $C_3$ or $C_4$ and resistor $R_3$ or $R_4$ configured in parallel.

As shown in FIG. 4, the transimpedance amplifier circuit 400 comprises three operational amplifier stages (406, 418, and 420) between the input terminal of the multi-stage operational amplifier 404 and the input terminal of the first pole, transimpedance amplifier 402. The odd number of operational amplifier stages between the input terminal of operational amplifier 404 and the input terminal of the first pole, transimpedance amplifier 402 ensures good stability within the transimpedance amplifier circuit 400.

In some embodiments, the negative feedback network 412 comprises an AC coupling element 424 positioned between differential feedback paths. The AC coupling element 424 provides AC coupling of the differential signals through capacitors $C_4$ and $C_5$. This provides a large impedance at the input and output of operational amplifier stage 406 at small frequencies so as not to degrade the in-band noise figure.

Figure 5A:
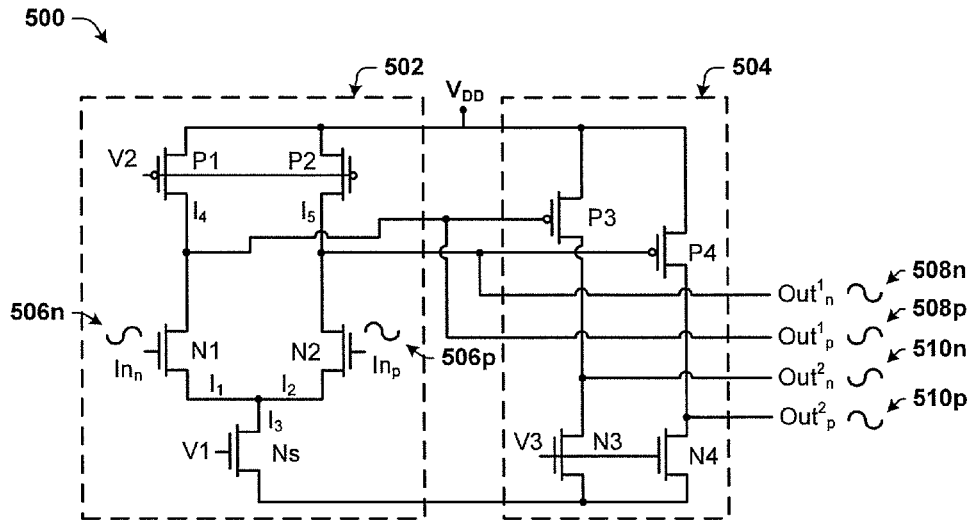
FIG. 5a illustrates a schematic diagram of a two stage operational amplifier having a differential input voltage.
Figure 5B:
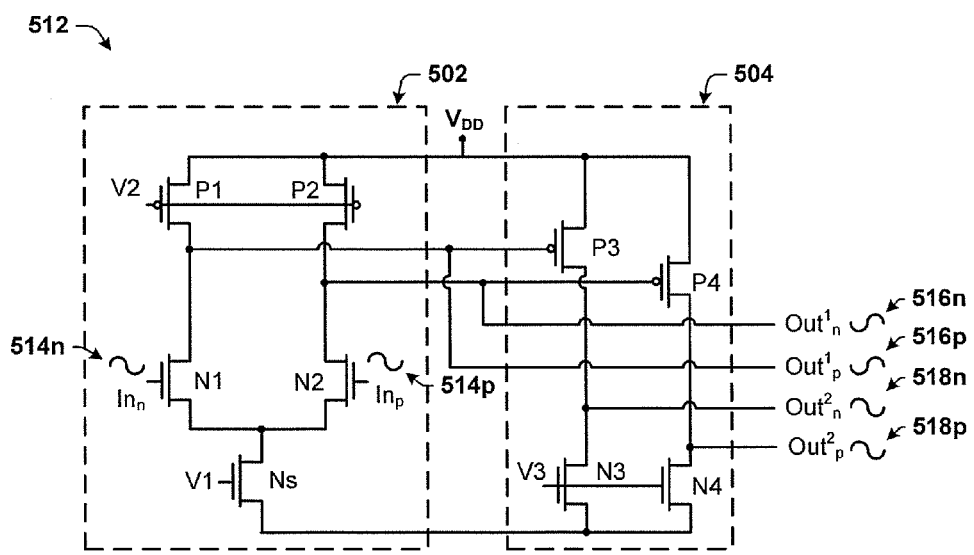
FIG. 5b illustrates a schematic diagram of a two stage operational amplifier having a common-mode input voltage.

It will be appreciated that a differential transimpedance amplifier circuit may receive as inputs common-mode or differential signals. The disclosed negative feedback network is able to provide a negative feedback for both common-mode and differential input signals. For example, FIGS. 5a-5b illustrate exemplary two stage Miller operational amplifiers 500 and 512. The operational amplifiers comprise a first operational amplifier stage 502 comprising transistors N1, N2, P1, and P2 and a second operational amplifier stage 504 comprising transistors N3, N4, P3, and P4. By connecting a disclosed negative feedback network, having an even number of operational amplifier stages, to the output of the first operational amplifier stage 502 of the two stage Miller operational amplifier a negative feedback is provided for both common-mode and differential mode input voltages. It will be appreciated that the use of a Miller operational amplifier is a non-limiting embodiment of a two stage operational amplifier, illustrated herein for exemplary purposes.

FIG. 5a illustrates the operational amplifier 500 having a differential mode input voltage. The differential mode input voltage is provided at the input terminals $In_n$, $In_p$ of the first operational amplifier stage 502. As shown in FIG. 5a, the input signal 506n at the first input terminal $In_n$ is complementary to the input signal 506p at the second input terminal $In_p$.

Within the first operational amplifier stage 502, transistors P1 and P2 form a current mirror since the gates of $P_1$ and $P_2$ are tied to $V_2$. PMOS transistors $P_1$ and $P_2$ of the current mirror generate currents $I_4$ and $I_5$, wherein $I_4=I_5$. Transistor Ns forms a current sink. Currents $I_1$ and $I_2$ are provided to the current sink, such that $I_1+I_2=I_3$. When the voltage of the first input signal $In_n$ is positive and the voltage of the second input signal $In_p$ is negative, $In_n>In_p$. Since $I_1>I_2$ and $I_4=I_5$, then $I_1>I_4$ and the output of the first operational amplifier stage 502 is negative with respect to the input signal $In_n$. For example, the input signal 506n at the first input terminal $In_n$ is complementary to the output signal 508n at the first output terminal of the first operational amplifier stage $Out^1_n$. Similarly, since $I_1>I_2$ and $I_4=I_5$, then $I_1>I_5$ and the output of the first operational amplifier stage 502 is negative with respect to the input signal $In_p$. For example, the input signal 506p at the second input terminal $In_p$ is complementary to the output signal 508p at the second output terminal of the first operational amplifier stage $Out^1_p$.

The second operational amplifier stage 504 operates in a similar fashion to the first operational amplifier stage 502. The second operational amplifier stage 504 generates an output signal that is positive with respect to the input signals, 506n and 506p. For example, the input signal 506n at the first input terminal In has the same polarity as the output signal 510n at the first output terminal of the second operational amplifier stage $Out^2_n$ and the input signal 506p at the second input terminal $In_p$ has the same polarity as the output signal 510p at the first output terminal of the second operational amplifier stage $Out^2_p$. Therefore, the output of the second operational amplifier stage 504 cannot be used along with a negative feedback loop having an even number of operational amplifier stages to provide a negative feedback signal that blocks out-of-band interference. Rather, using the output of the second stage as a feedback signal will amplify a common-mode input signal, leading to common-mode oscillations or in other words common mode instability in the demodulator due to the limited bandwidth of the common-mode feedback circuits of operational amplifiers.

FIG. 5b illustrates the operational amplifier 512 having a common-mode input voltage. The common-mode input voltage is provided at the inputs $In_n$, $In_p$ of the first operational amplifier stage 502. As shown in FIG. 5b, the input signal 514n at the first input terminal In has the same polarity as the input signal 514p at the second input terminal $In_p$. For the same reason as above, the output of the first operational amplifier stage 502 is negative with respect to the input signal $In_n$. Therefore, the input signal 514n at the first input terminal $In_n$ is complementary to the output signal 516n at the first output terminal of the first operational amplifier stage $Out^1_n$ and the input signal 514p at the second input terminal $In_p$ is complementary to the output signal 516p at the second output terminal of the first operational amplifier stage $Out^1_p$.

In contrast, the output signal of the second operational amplifier stage 504 is not a negative output but is rather a positive output. For example, the input signal 514n at the first input terminal $In_n$ has the same polarity as the output signal 518n at the first output terminal of the second operational amplifier stage $Out^2_n$ and the input signal 514p at the second input terminal $In_p$ has the same polarity as the output signal 518p at the second output terminal of the second operational amplifier stage $Out^2_p$. Therefore, the output of the second operational amplifier stage 504 cannot be used for a negative feedback signal.

Accordingly, by implementing a negative feedback network between the first stage and second stage of a multi-stage operational amplifier, the demodulator is made less sensitive against out-of-band interference since it provides a negative feedback signal for both common-mode and differential signals as shown in the examples of FIGS. 5a-5b.

Figure 6:
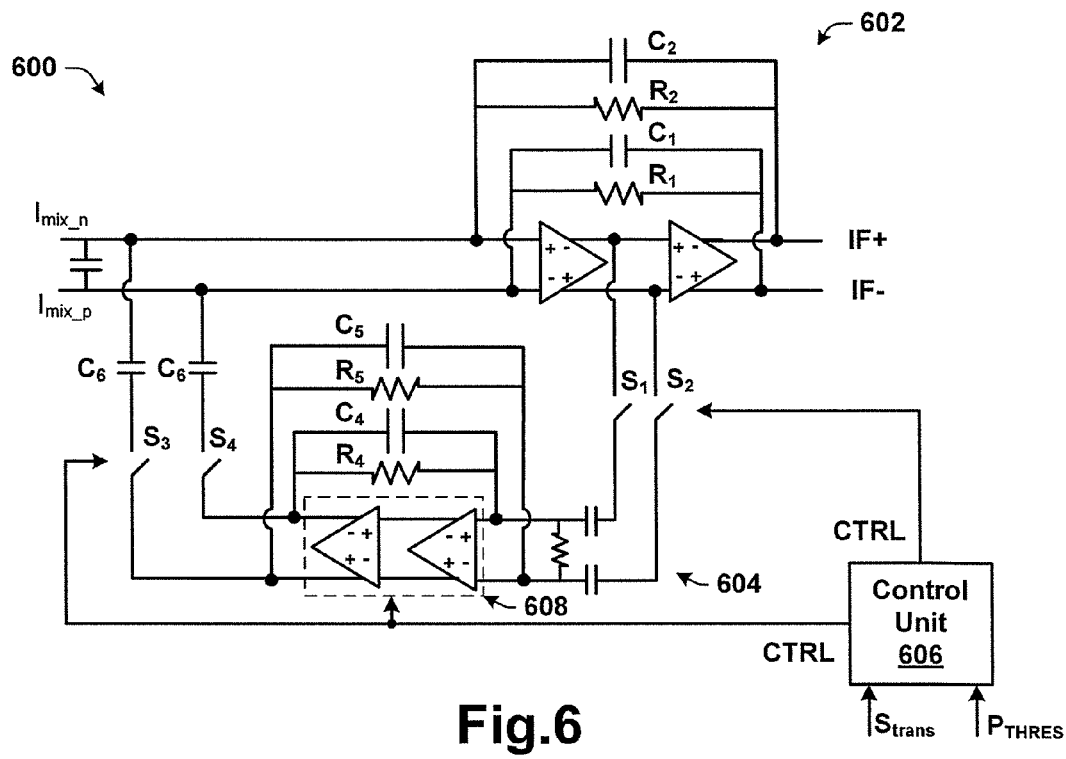
FIG. 6 illustrates a schematic diagram of some embodiments of a transimpedance amplifier circuit having a negative feedback network that can be selectively operated.

FIG. 6 illustrates a schematic diagram of some embodiments of a transimpedance amplifier circuit 600 having a negative feedback network that can be selectively operated. As shown in FIG. 6, the transimpedance amplifier circuit 600 comprises a negative feedback network 604 configured to filter the differential input signals $I_{mix\_n}$, $I_{mix\_p}$ of the first pole, transimpedance amplifier 602 to remove out-of-band interference.

Usually the power of a transmitted signal is known by a transceiver. For example, the transmitted signal power may depend on the quality of communication between a mobile phone and the base station. In one embodiment, a demodulator may comprise a control unit 606 configured to selectively connect the negative feedback network 604 to the first pole, transimpedance amplifier 602 based upon the power of a transmitted source signal $S_{trans}$ (i.e., a transmitted signal in a transceiver that is the source of the out-of-band transmitted signal within a demodulator).

For example, the control unit 606 can be configured to connect the negative feedback network 604 to the first pole, transimpedance amplifier 602 if the power of the transmitted source signal exceeds a predetermined power threshold $P_{THRES}$, which may cause non-linearities in the transimpedance amplifier 602. The control unit 606 connects the negative feedback network 604 to the first pole, transimpedance amplifier 602 by generating a control signal CTRL that closes switches $S_1$, $S_2$, $S_3$, and $S_4$ and that turns on operational amplifier 608 to provide additional filtering. If the transmitted power does not exceed the predetermined power threshold $P_{THRES}$, the control unit 606 is configured to disconnect the negative feedback network 604 from the first pole, transimpedance amplifier 602. The control unit disconnects the negative feedback network 604 from the first pole, transimpedance amplifier 602 by generating a control signal CTRL that opens switches $S_1$, $S_2$, $S_3$, and $S_4$ and that turns off operational amplifier 608 to save power.

Figure 7:
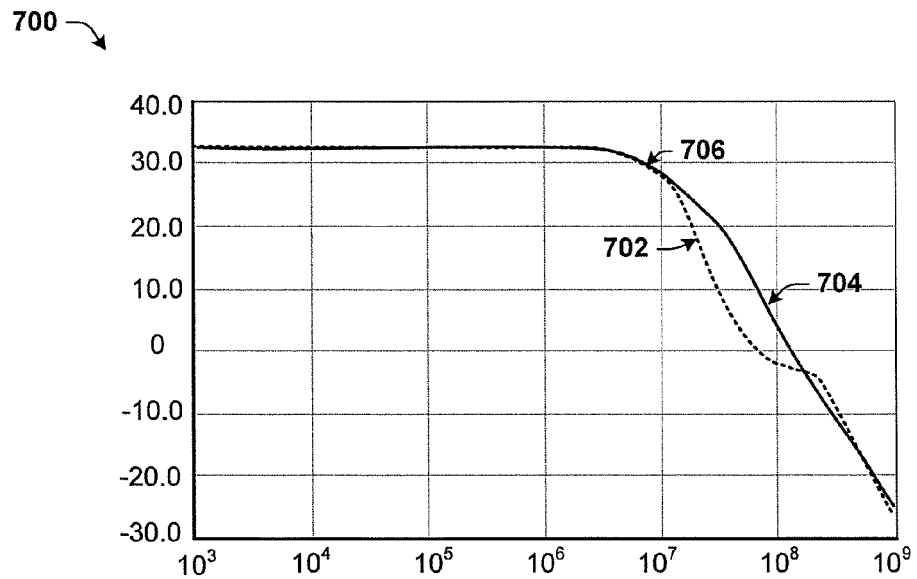
FIG. 7 is a graph showing a comparison filter characteristics of a conventional first-order transimpedance amplifier compared to the disclosed transimpedance amplifier circuit.

FIG. 7 illustrates a graph 700 of the magnitude response of the transimpedance amplifier circuit disclosed herein. The graph 700 illustrates the magnitude of a transmitted signal (y-axis) as a function of frequency (x-axis). The magnitude response of a traditional transimpedance amplifier is shown as trend line 704, while the magnitude response of the disclosed transimpedance amplifier with a negative feedback network is shown as trend line 702.

As shown in graph 700, for both trend lines 702 and 704 the 3 dB bandwidth 706 is the same (about 7.4 MHz). However, the transimpedance amplifier with a negative feedback network provides successful attenuation for out-of-band transmitted signals over a range of different frequencies. For example, at 30 MHz the disclosed transimpedance amplifier circuit provides a signal attenuation of about 10 dB greater attenuation of the transmitted signal when compared with the conventional first order transimpedance amplifier, as illustrated by the 10 dB attenuation between trend lines 702 and 704. At 45 MHz the disclosed transimpedance amplifier circuit provides a signal attenuation of about 12 dB greater attenuation of the transmitted signal when compared with the conventional first order transimpedance amplifier, as illustrated by the 10 dB attenuation between trend lines 702 and 704.

Figure 8:
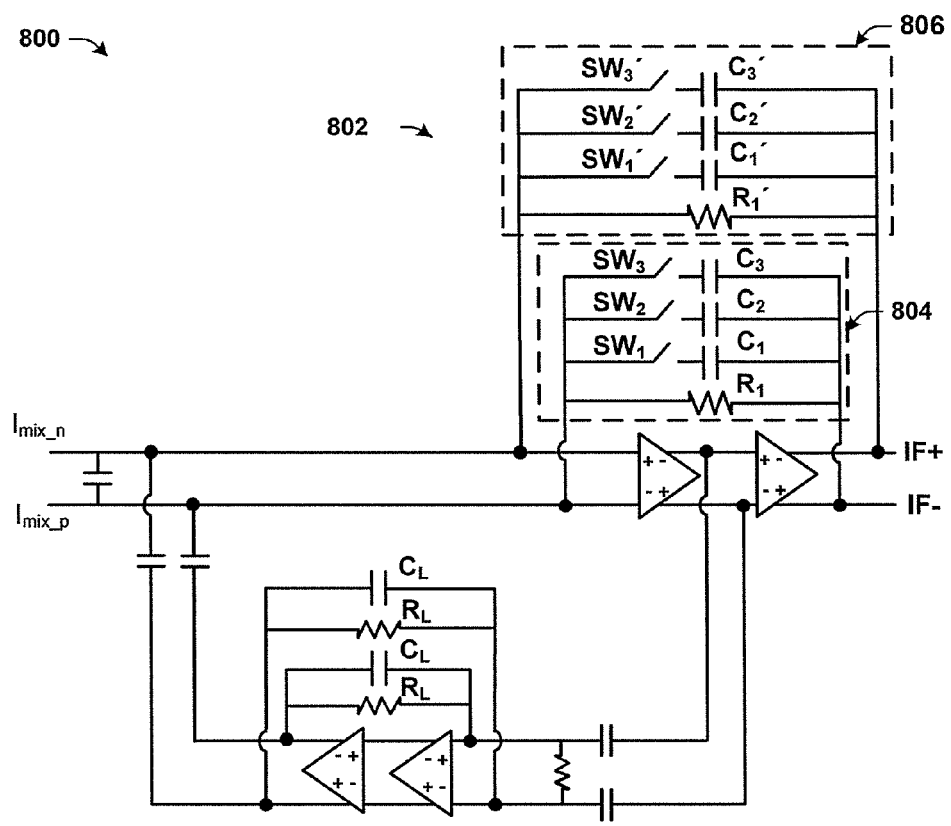
FIG. 8 illustrates a schematic diagram of some embodiments of a transimpedance amplifier circuit having a negative feedback loop.

FIG. 8 illustrates a schematic diagram of some embodiments of a transimpedance amplifier circuit 800 having a first pole transimpedance amplifier 802 and a negative feedback network. As shown in FIG. 8, the first pole transimpedance amplifier 802 comprises a plurality of feedback loops, 804 and 806. Each feedback loop 804, 806 contains a resistor $R_1$, $R_1'$ connected in parallel to a plurality of capacitive paths. Each capacitive path comprises a switch and a capacitor having a different value. For example, within a first feedback loop 804 a first capacitive path contains a switch $SW_1$ and a capacitor $C_1$, a second capacitive path contains a switch $SW_2$ and a capacitor $C_2 > C_1$, a third capacitive path contains a switch $SW_3$ and a capacitor $C_3 > C_2$, etc. By selectively operating switches within the feedback loops 804, 806 a capacitor value can be selected properly filters the received signal.

Figure 9:
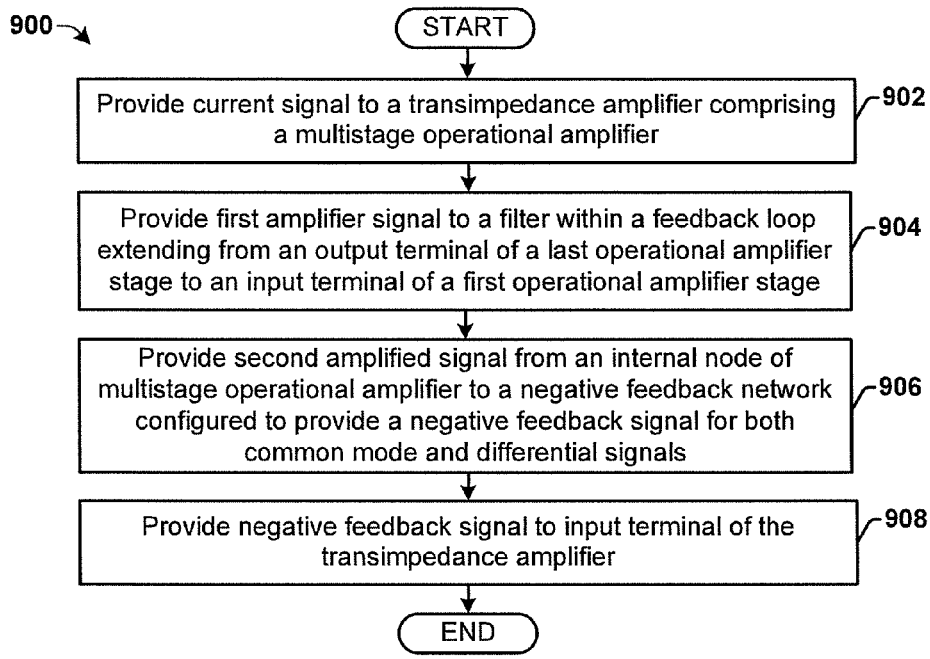
FIG. 9 illustrates a flow diagram of an exemplary method for improving the linearity of a transimpedance amplifier.

FIG. 9 illustrates a flow diagram of an exemplary method 900 for improving the linearity of a transimpedance amplifier within a demodulator.

While method 900 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

At 902 a current signal is provided to a transimpedance amplifier comprising a multi-stage operational amplifier. The multi-stage operational amplifier comprises a first operational amplifier stage and a last operational amplifier stage, located downstream of the first operational amplifier stage. In some embodiments, the multi-stage operational amplifier comprises a two stage operational amplifier.

At 904 a first amplified signal is provided to a filter within a feedback loop extending from an output terminal of a last operational amplifier stage to an input terminal of a first operational amplifier stage.

At 906 a second amplified signal output from an internal node of the multi-stage operational amplifier is provided to a negative feedback network configured to provide a negative feedback signal for both common mode and differential signals. The negative feedback signal has a frequency that corresponds to the frequency of an out-of-band transmitted signal. The negative feedback signal also comprises an amplitude having an opposite polarity as the out-of-band transmitted signal.

At 908 the negative feedback signal is provided to an input terminal of the transimpedance amplifier. The negative feedback signal is added to the input signal of a transimpedance amplifier to reduce the amplitude of the out-of-band transmitted signal. Therefore, the negative feedback signal attenuates the out-of-band transmitted signal.

Figure 10:
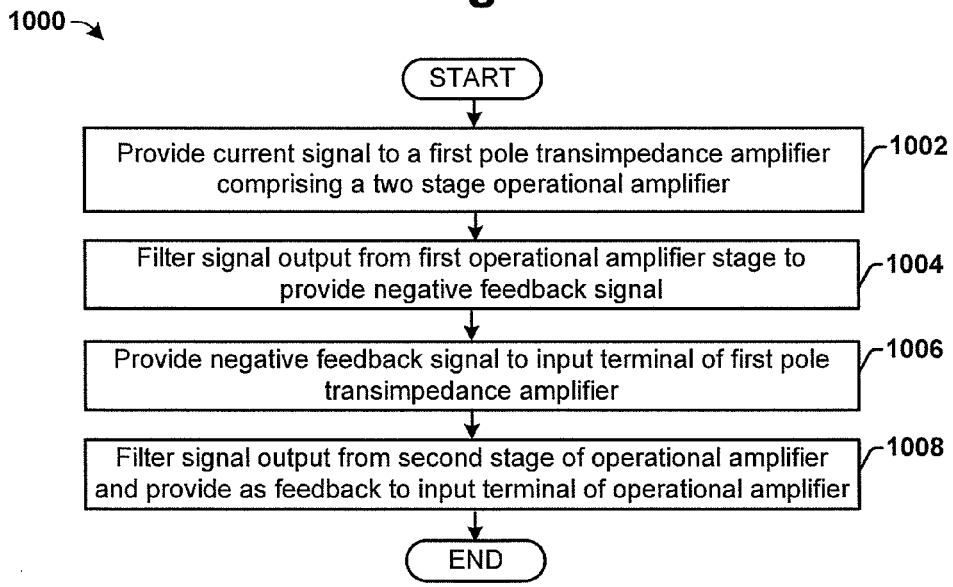
FIG. 10 illustrates a flow diagram of another exemplary method for improving the linearity of a transimpedance amplifier having a two stage operational amplifier.

FIG. 10 illustrates a flow diagram of another exemplary method 1000 for improving the linearity of a transimpedance amplifier having a two stage operational amplifier.

At 1002 a current signal is provided to a first pole, transimpedance amplifier comprising a multi-stage operational amplifier.

At 1004 a signal output from the first operational amplifier stage is filtered to provide a negative feedback signal.

At 1006 the negative feedback signal is feed back to the input terminal of the first pole, transimpedance amplifier.

At 1008 a signal output from the second operational amplifier stage filtered and feed back to the input terminal of the operational amplifier.

Although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. A demodulator circuit, comprising:
   a transimpedance amplifier configured to receive an input signal having out-of-band transmitted signals, comprising:
     a first operational amplifier having an input terminal and an output terminal;
     a first RC feedback network extending from the output terminal to the input terminal;
   a negative feedback network extending from the transimpedance amplifier to an input terminal of the transimpedance amplifier, wherein the negative feedback network is configured to provide a negative feedback signal for common mode and differential input signals that suppresses out-of-band-transmitted signals within the input signal, and wherein the negative feedback network comprises a negative feedback filtering element configured to provide the negative feedback signal having a frequency corresponding to a frequency of the out-of-band transmitted signals;
   one or more switches connected between an internal node of the first operational amplifier and the negative feedback filtering element; and
   a control unit configured to generate a control signal that selectively opens and closes the one or more switches to connect or disconnect the negative feedback network from the transimpedance amplifier.

2. The demodulator circuit of claim 1, wherein the first operational amplifier comprises a first operational amplifier stage and a second operational amplifier stage, located downstream of the first operational amplifier stage.

3. The demodulator circuit of claim 2, wherein the negative feedback network extends from an internal node of the first operational amplifier to the input terminal of the transimpedance amplifier.

4. The demodulator circuit of claim 1, wherein the negative feedback filtering element comprises a second operational amplifier connected in parallel to a second RC feedback network.

5. The demodulator circuit of claim 1, wherein a number of operational amplifier stages between the input terminal of the first operational amplifier and an output of the negative feedback network, along the negative feedback network, is an odd number.

6. The demodulator circuit of claim 1,
   wherein the control unit is configured to selectively open the one or more switches when a transmitted signal, which is the source of the out-of-band transmitted signals, has a power that is below a predetermined power threshold; and
   wherein the control unit is configured to selectively close the one or more switches when the transmitted signal, which is the source of the out-of-band transmitted signals, has a power that exceeds the predetermined power threshold.

7. A transimpedance amplifier (TIA) circuit, comprising,
   a transimpedance amplifier configured to filter an input signal having out-of-band transmitted signals, wherein the transimpedance amplifier comprises a plurality of operation amplifier stages; and
   a negative feedback network, extending from an internal node, located between an output of a first one of the plurality of operation amplifier stages and an input of a second one of the plurality of operation amplifier stages, to an input terminal of the transimpedance amplifier, and configured to provide a negative feedback signal having a frequency that corresponds to the frequency of the out-of-band transmitted signals and an amplitude having an opposite polarity as the out-of-band transmitted signals.

8. The TIA circuit of claim 7, wherein the transimpedance amplifier comprises:
   a first multi-stage operational amplifier having a first operational amplifier stage and a second operational amplifier stage located downstream of the first operational amplifier stage; and
   a first RC feedback network extending from an output terminal of the second operational amplifier stage to an input terminal of the first operational amplifier stage.

9. The TIA circuit of claim 8, wherein an odd number of operational amplifier stages are configured between the input of the first multi-stage operational amplifier and an output of the negative feedback network, along the negative feedback network.

10. The TIA circuit of claim 8, wherein the negative feedback network comprises a negative feedback filtering element comprising an active band pass or high pass filter.

11. The TIA circuit of claim 10, wherein the negative feedback filtering element comprises a second multi-stage operational amplifier connected in parallel to a second RC feedback network.

12. The TIA circuit of claim 10, further comprising:
   one or more switches connected between the internal node of the first multi-stage operational amplifier and the negative feedback filtering element; and
   a control unit configured to generate a control signal that selectively opens and closes the one or more switches to connect or disconnect the negative feedback network and the transimpedance amplifier.

13. The TIA circuit of claim 12,
   wherein the control unit is configured to selectively open the one or more switches when a transmitted signal, which is the source of the out-of-band transmitted signals, has a power that is below a predetermined power threshold; and
   wherein the control unit is configured to selectively close the one or more switches when the transmitted signal, which is the source of the out-of-band transmitted signals, has a power that exceeds the predetermined power threshold.

14. The TIA circuit of claim 7, wherein the negative feedback network is configured to generate negative feedback signals for the differential and common-mode input signals.

15. A method for improving linearity of a transimpedance amplifier circuit, comprising:
- providing a current signal to a transimpedance amplifier comprising a multi-stage operational amplifier having a first operational amplifier stage and a last operational amplifier stage;
- providing a first amplified signal to a filter within a feedback loop extending from an output terminal of the last operational amplifier stage to an input terminal of the first operational amplifier stage;
- providing a second amplified signal from an internal node of the multi-stage operational amplifier, located between an output of the first operational amplifier stage and an input of the last operational amplifier stage, to a negative feedback network configured to provide a negative feedback signal; and
- providing the negative feedback signal to an input terminal of the first pole transimpedance amplifier to suppress out-of-band-transmitted signals within the transimpedance amplifier circuit.

16. The method of claim 15, wherein the second amplified signal is provided from an internal node comprising an output of the first operational amplifier stage.

17. The method of claim 15, further comprising:
- selectively connecting or disconnecting the negative feedback network to the internal node of the multi-stage operational amplifier.

18. The method of claim 17,
- wherein the negative feedback network is selectively disconnected from the internal node of the multi-stage operational amplifier when a transmitted signal, which is the source of the out-of-band transmitted signals, has a power that is below a predetermined power threshold; and
- wherein the negative feedback network is selectively connected to the internal node of the multi-stage operational amplifier when a transmitted signal, which is the source of the out-of-band transmitted signals, has a power that exceeds a predetermined power threshold.

19. A demodulator circuit, comprising:
- a transimpedance amplifier having an input terminal configured to receive an input signal having out-of-band transmitted signals, comprising:
  - a first operational amplifier having one or more first operational amplifier stages;
  - a first RC feedback network extending from an output terminal of the first operation amplifier to the input terminal; and
- a negative feedback network extending from the transimpedance amplifier to an input terminal of the transimpedance amplifier, wherein the negative feedback network comprises a negative feedback filtering element having a second operational amplifier having one or more second operational amplifier stages;
- wherein an odd number of operational amplifier stages are configured between the input of the transimpedance amplifier and an output of the negative feedback network, along the negative feedback network.

* * * * *